US006822488B1

(12) United States Patent
Riley

(10) Patent No.: US 6,822,488 B1
(45) Date of Patent: Nov. 23, 2004

(54) FREQUENCY SYNTHESIZER

(75) Inventor: Thomas Atkin Denning Riley, Osgoode (CA)

(73) Assignee: Skyworks Solutions, Inc., Newport Beach, CA (US)

( * ) Notice: Subject to any disclaimer, the term of this patent is extended or adjusted under 35 U.S.C. 154(b) by 811 days.

(21) Appl. No.: 09/629,484

(22) Filed: Jul. 31, 2000

(51) Int. Cl.[7] .............................................. H03B 21/00
(52) U.S. Cl. ..................................... 327/107; 327/116
(58) Field of Search ................................ 327/116, 119, 327/121, 105, 156, 158, 107, 271, 276, 407

(56) References Cited

U.S. PATENT DOCUMENTS

| 5,122,757 A | | 6/1992 | Weber et al. ................. 327/105 |
| 5,537,069 A | * | 7/1996 | Volk ........................... 327/149 |
| 5,656,958 A | * | 8/1997 | Albert et al. ................. 327/105 |
| 5,889,436 A | | 3/1999 | Yeung et al. ................... 331/2 |
| 5,977,805 A | * | 11/1999 | Vergnes et al. ............. 327/107 |
| 6,366,148 B1 | * | 4/2002 | Kim ............................ 327/262 |

* cited by examiner

Primary Examiner—Dinh T. Le
(74) Attorney, Agent, or Firm—Robert A. Wilkes

(57) ABSTRACT

The present invention provides a method and apparatus which provides a signal with an output frequency higher than an input frequency. A phase generator generates multiple phase signals from the input signal with each phase signal having the same frequency as the input signal but being out of phase with the input signal by multiples of a set time interval. These phase signals are transmitted to a multiplexer. The multiplexer output is determined by a select word generated by an accumulator from a stored value. The accumulator is clocked by the multiplexer output and the accumulator adds a control word with a set value to the stored value in the accumulator. This addition is accomplished at every cycle of the multiplexer output. By judiciously choosing control word and the time interval between phases, frequencies higher that the input frequency can be generated at the multiplexer output.

24 Claims, 4 Drawing Sheets

FREQUENCY SYNTHESIZER

FIELD OF THE INVENTION

The present invention relates to frequency synthesizers and more specifically, to frequency synthesizers which produce an output frequency higher than the input frequency.

BACKGROUND OF THE INVENTION

In digital communications systems, it is often necessary to provide a clock signal with a frequency different from that of the available reference signal. This necessity may require independent crystal oscillators if both frequency sources need to be spectrally pure. However, independent crystal oscillators increase the cost of the equipment and can cause problems if the crystal oscillators drift differently with age and temperature.

One approach to solving the above problem of different required frequencies is to synthesize a signal with a high frequency from a reference signal having a reference frequency.

Using well known phase locked loop (PLL) techniques, this high frequency is generated and is then divided into a lower desired frequency. Typically, the reference frequency is multiplied by an integer factor N to produce the high frequency and then divided by another integer factor M to obtain the desired frequency. This method works well if the desired frequency is a convenient ratio of the reference frequency such as 1/2, 3/2, or 5/6. However, if the desired frequency is not a convenient ratio of the reference frequency, this method can prove cumbersome. For example, if the desired frequency is 12 MHz and the reference frequency is 19.68 MHz, the reference frequency must be multiplied by N=25 and the resulting frequency must be divided by M=41. The very high frequency generated in this example would result in higher power consumption for integrated circuits.

An alternative approach is to divide the reference frequency and then multiply the divided frequency to obtain the desired frequency. However, this method has a significant drawback in that phase noise is multiplied along with the divided frequency.

U.S. Pat. No. 3,976,945 provides yet another alternative. This patent discloses performing a non integer division of the input signal to obtain an output signal with the desired frequency. However, in this case the output frequency must necessarily be less than the input frequency. If the desired frequency were higher than the input frequency, this method would not be applicable.

Accordingly, there is a need for a method and an apparatus which can provide a desired output frequency higher than the input frequency without the power consumption and phase noise of the above methods.

SUMMARY OF THE INVENTION

The present invention provides a method and apparatus which provides a signal with an output frequency higher than an input frequency. A phase generator generates multiple phase signals from the input signal with each phase signal having the same frequency as the input signal but being out of phase with the input signal by multiples of a set time interval. These phase signals are transmitted to a multiplexer. The multiplexer output is determined by a select word generated by an accumulator from a stored value. The accumulator is clocked by the multiplexer output and the accumulator adds a control word with a set value to the stored value in the accumulator. This addition is accomplished at every cycle of the multiplexer output. By judiciously choosing control word and the time interval between phases, frequencies higher that the input frequency can be generated at the multiplexer output.

In a first aspect, the present invention sees to provide a frequency synthesizer for producing an output signal based on an input signal and a predetermined control signal, the input signal having an input frequency, the output signal having an output frequency higher than the input frequency, the synthesizer comprising: a multiphase reference generator having means for generating a plurality of phase signals from the input signal, each phase signal having a frequency substantially equal to the input frequency, and each phase signal being out of phase with the other phase signals by a multiple of a predetermined time interval; a multiplexer having means for receiving the plurality of phase signals, and having means for selecting one of the plurality of phase signals as a multiplexer output signal; and a phase selector having means for receiving the predetermined control signal and the multiplexer output signal, and having means for generating a phase selector output signal based on the control signal and the multiplexer output signal; wherein the phase selector output signal is operatively coupled to the means for selecting one of the plurality of phase signals, and the multiplexer output signal is the frequency synthesizer output signal.

In a second aspect, the present invention seeks to provide a frequency synthesizer for producing an output signal from an input signal based on a predetermined control signal, the input signal having an input frequency, the output signal having an output frequency higher than the input frequency, the synthesizer comprising: a multiphase reference generator having means for generating a plurality of phase signals from the input signal, each phase signal having a frequency substantially equal to the input frequency, and each phase signal being out of phase with the other phase signals by a multiple of a predetermined time interval;

a multiplexer having means for receiving the plurality of phase signals, having means for selecting at least two of the plurality of phase signals, and having means for blending/interpolating the at least two of the plurality of phase signals into a multiplexer output signal; and a phase selector having means for receiving the predetermined control signal and the multiplexer output signal, and having means for generating a phase selector output signal based on the control signal and the multiplexer output signal; wherein the phase selector output signal is operatively coupled to the means for selecting one of the plurality of phase signals, and the frequency synthesizer output signal is the multiplexer output signal.

In a third aspect, the present invention seeks to provide a frequency synthesizer comprising: a phase generator having means for receiving an input signal having a reference frequency and means for generating a plurality of phase signals having a frequency substantially equal to the reference frequency, each phase signal being out of phase with the input signal by a multiple of a predetermined time interval; a multiplexer having means for receiving the plurality of phase signals, and having means for selecting one of the plurality of phase signals as a multiplexer output signal, a binary digital accumulator having a clock input, an accumulator input and an accumulator output, the multiplexer output signal being operatively coupled to the clock input; and a storage means for storing a predetermined control word, the storage means being operatively connected to accumulator input, wherein the predetermined control word is added by the binary digit accumulator to a stored value on every cycle of the multiples output the multiplexer output is selected by the selector output and is based on at least one of the plurality of phase signals and each successive multiplexer output leads its predecessor by a multiple of the predetermined time interval.

In a fourth aspect, the present invention seeks to provide a method of synthesizing an output signal from based on an input signal and a predetermined control signal, the input signal having an input frequency, the output signal having an output frequency higher than the input frequency, the method comprising the steps of:

(a) generating a plurality of phase signals from the input signal;

(b) selecting one of the plurality of phase signals as a selected phase signal;

(c) generating the output signal from the selected phase signal;

(d) adding the predetermined control word to a stored value to generate a select signal based on the selected phase signal;

(e) selecting one of the plurality of phase signals as the selected phase signal based on at least a portion of the select signal;

(f) repeating steps (c) to (e) for every cycle of the output signal.

DESCRIPTION OF THE FIGURES

A better understanding of the invention may be obtained by reading the detailed description of the invention below, in conjunction with the following drawings, in which.

DESCRIPTION OF THE PREFERRED EMBODIMENT

Figure 1:
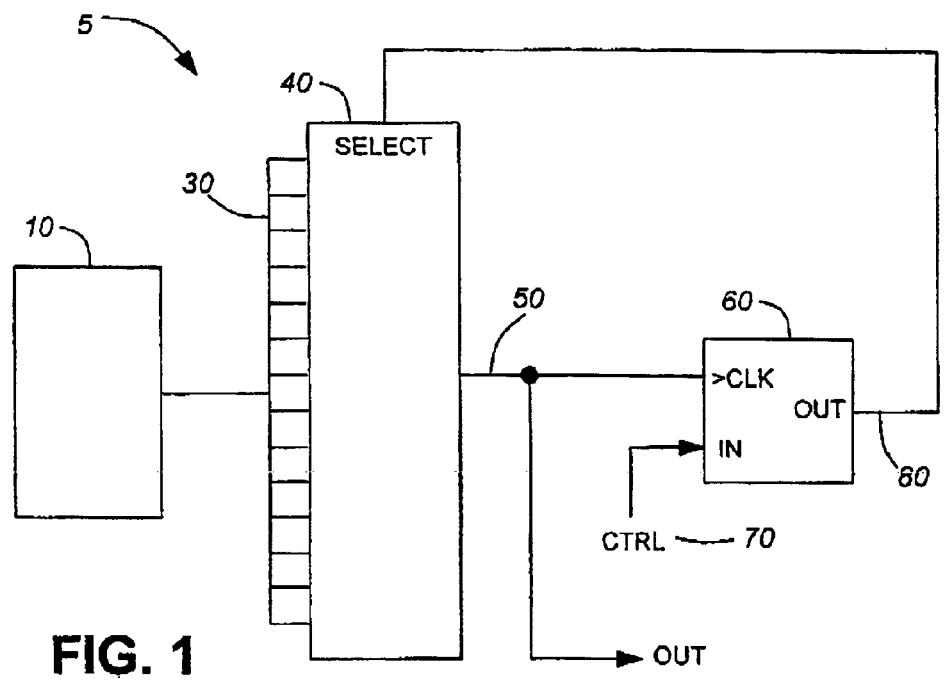
FIG. 1 is a block diagram of a frequency synthesizer in accordance with the present invention.

Referring to FIG. 1, there is shown a block diagram of a frequency synthesizers. A multiphase reference generator 10 generates multiple phases 30 of a signal with a reference frequency. These multiple phase signals 30 are sent to a multiplexer 40. The output 50 of the multiplexer 40 serves as both the output signal and as the clock of a phase selector 60. The phase selector 60 receives a control word 70 at port IN. A portion of the selector output 80 of the phase selector 60 is used as a SELECT signal for the multiplexer 40. The SELECT signal is used to select which one of the multiple phase signals 30 is used as the output 50 of the multiplexer 40.

Figure 2:
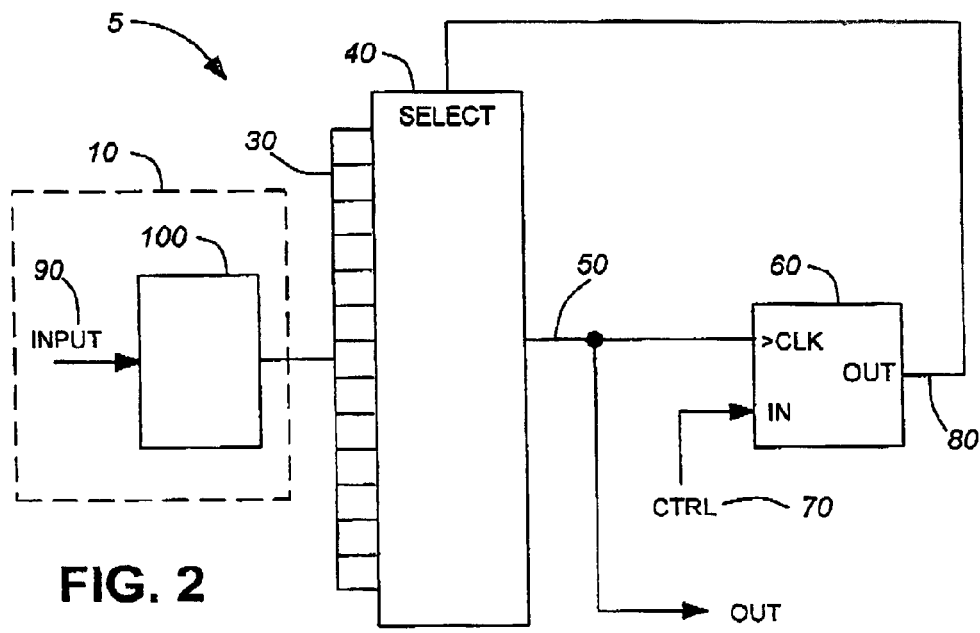
FIG. 2 is a block diagram of a first embodiment of the invention.
Figure 3:
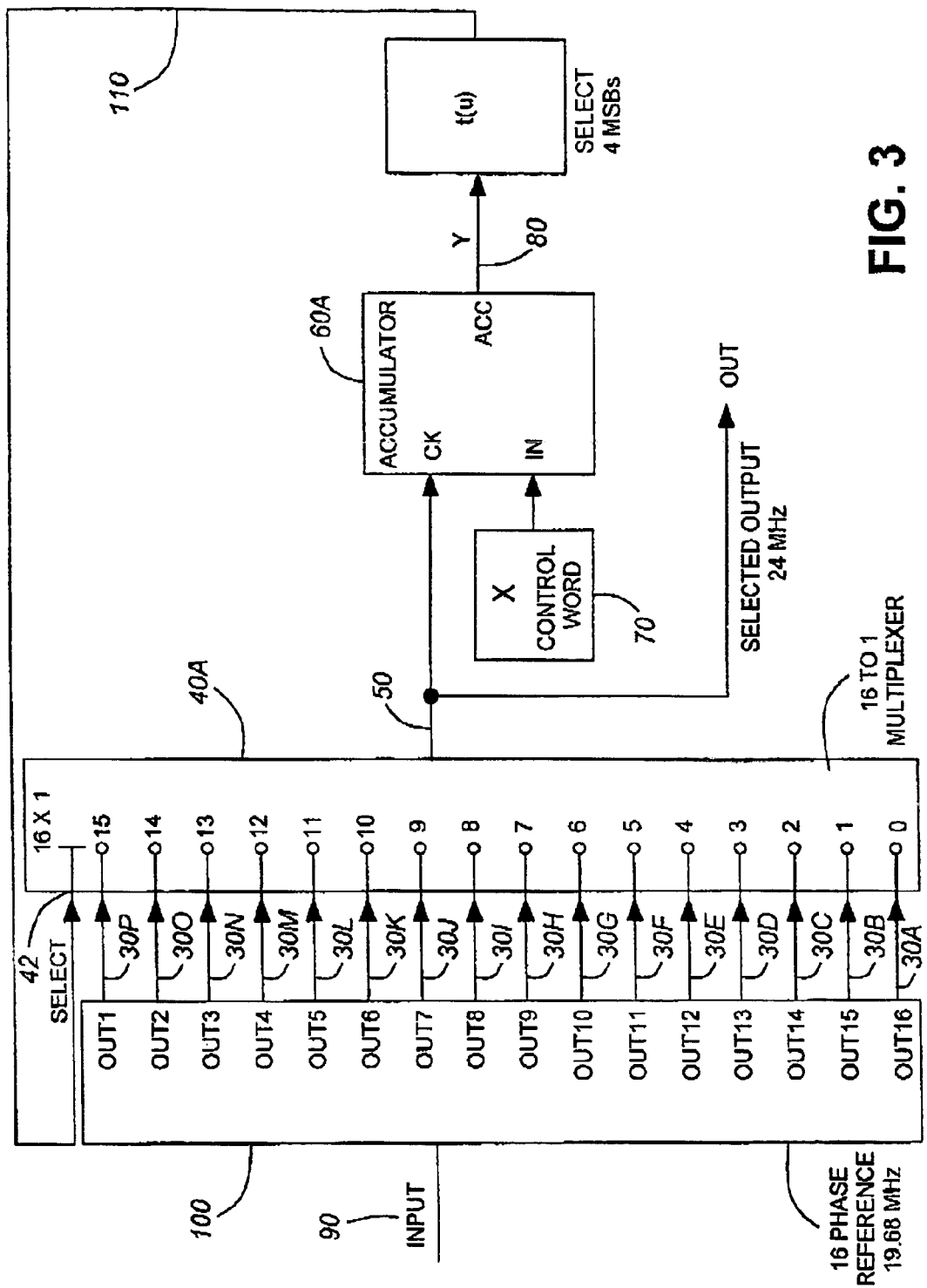
FIG. 3 is a block diagram of a specific implementation of the embodiment illustrated in FIG. 2.

Referring to FIGS. 2 and 3, a specific embodiment of the invention is illustrated. In this embodiment, the multi-phase reference generator is comprised of a reference signal 90 being sent to a phase By generator 100. The phase generator 100 generates multiple phase signals 30 from the reference signal 90 and the multiple phase signals 30 are sent to the multiplexer 40. The input signal 90 has a reference frequency of 19.86 MHz and the phase generator 100 generates 16 phase signals 30A–30P. (see FIG. 3) These phase signals are sent to a 16:1 multiplexer, (MUX) 40A. The 16:1 MUX 40A selects one of the its sixteen phase signals 30A–30P based on the input to select port 42. The numbers in the block 40A refer to the select values required at the select port 42 to select the phase signal. Thus, to select OUT11 (phase signal 30F), a binary value of 101 (decimal value 5) must be inputted to the select port 42. The MUX 40A output 50 is used to clock a 20 bit accumulator 60A which serves as the phase selector 60. The accumulator 60A is fed a control word 70 which the accumulator 60A adds to a stored value on every cycle of the MUX output 50.

The input to the select port 42 is a portion of the selector output 80. In this case the 4 most significant bits (MSB) of the selector output 80 serves as the select word 110 sent to select port 42.

The selector output 80 is the binary value of the stored value in the accumulator 60A, a binary digital accumulator. Thus, if the selector output 80 has a decimal value of 9001 and the control word 70 has a decimal value of 10, on the next cycle of the MUX output 50 the selector output 80 becomes 9001+10=9011 (decimal value) as the control word is added to the stored value, thereby changing the selector output 80. In other words, the accumulator adds a control word X to a stored value $Y_0$ to produce a new stored value $Y_1$ on each cycle of the selected phase signal (any one of 30A–30P). So, for every cycle of the selected phase signal, a new stored value $Y_1$ is determined by $$Y_1 = X + Y_0 \qquad (1)$$

where $Y_0$ is the previous stored value. When the accumulator 60A overflows, it produces a stored value $$Y_1 = X + Y_0 - K \qquad (2)$$

where K is the maximum value which the accumulator can store. If the control word X is negative, then the new stored value becomes $$Y_1 = X + Y_0 + K \qquad (3)$$

This is how most currently known binary digital accumulators handle overflow. It should be noted that, by varying the control word X, the frequency of the output signal 50 can be varied. Thus, the value of the control word X effectively controls the frequency of the output signal 50.

Regarding the phase generator 100, the phase signals 30A–30P it produces all have the same frequency as the input or reference signal 90. However, each phase signal 30A–30P is out of phase with the reference signal 90 by a time value which is a multiple of a set time interval. For this example, the set time interval is $$\frac{1}{(16 \times 19.86 \text{ MHz})} = 3.176 \text{ ns.} \qquad (4)$$

Figure 4:
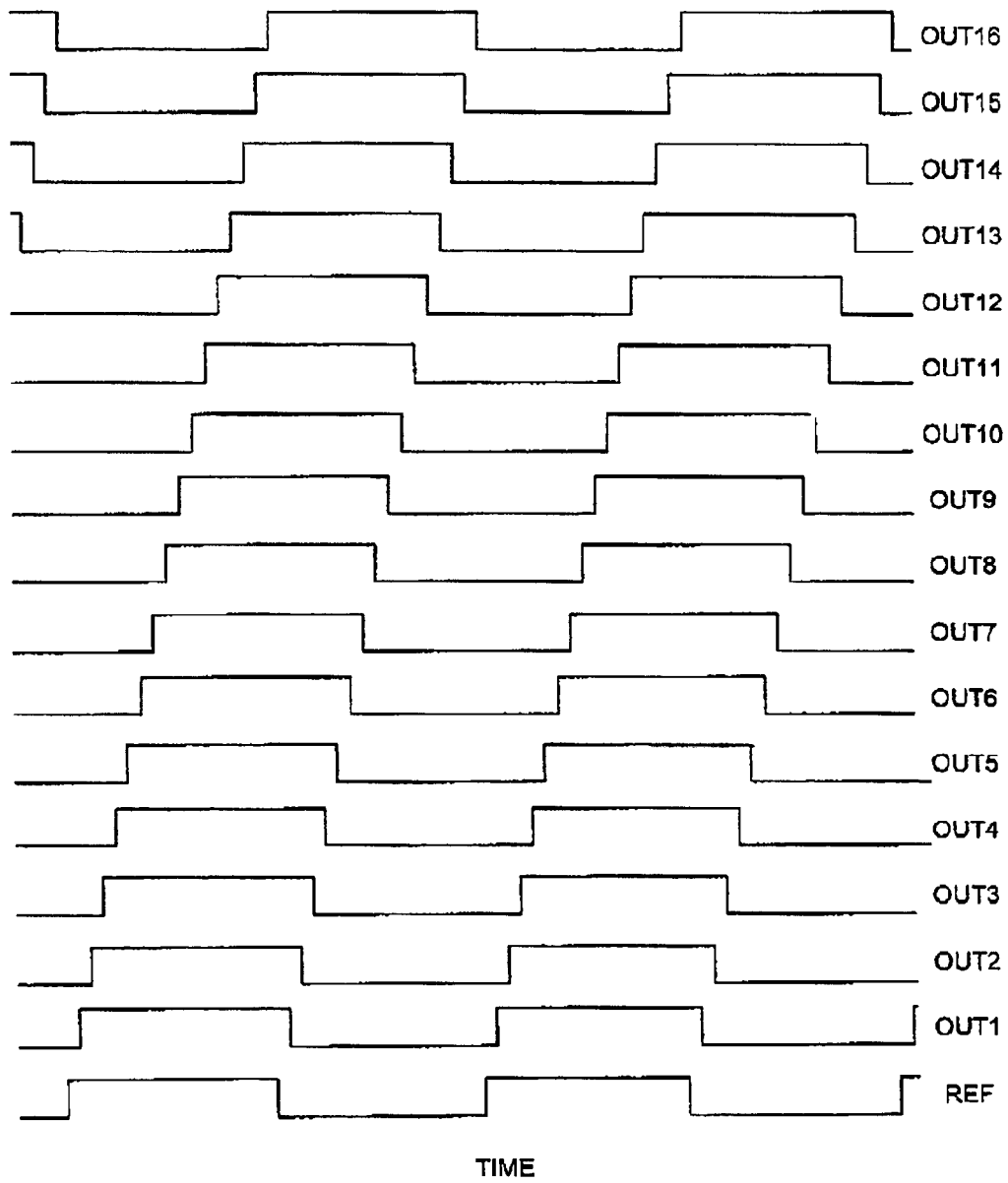
FIG. 4 is a timing diagram for the sixteen phase signals used in the embodiment in FIG. 3.

Thus, OUT1 in FIG. 2 would be 3.176 ns later than the reference signal, OUT2 would be 3.176 ns×2 later than the reference signal and 3.176 ns later than OUT1. To best illustrate this, FIG. 4 shows the timing diagrams of the phase signal OUT1–OUT16 along with the reference signal REF. It should be noted that in FIG. 4, each division in the time axis (horizontal axis) represents 3.176 ns.

From the above, the required set time interval between phase signals for a given number of phase signals and reference frequency can be generalized to be:

$$\text{Set Time Interval} = \frac{1}{(\text{number of phase signals}) \times (\text{reference frequency})} \quad (5)$$

The phase generator 100 can be a multiple stage Johnson counter—in this case it would be an 8 stage Johnson counter. The phase generator 100 can also be a delay lock loop (DLL) circuit. Alternatively, the multiple phase signals can be generated by a ring oscillator.

To assure trouble free operation and to obtain higher output frequencies, the phase selector 60 (as embodied by the accumulator 60A) should select progressively earlier phase signals rather than progressively later phase signals. This means that each successive phase signal should lead its predecessor phase signal by a multiple of the set time interval. This provides a shorter cycle time for the MUX output 50 than the input or reference signal, thereby obtaining a higher frequency.

To best illustrate the workings of the synthesizer, the following example is provided:

The output frequency of the synthesizer is given by $$f_{out} = \frac{f_{ref}}{\left(1 - \frac{X}{2^n}\right)} \quad (6)$$

where $f_{out}$ is the output frequency, $f_{ref}$ is the frequency of the 16 phase reference, X is the control word controlling the accumulator and n is the number of bits in the accumulator. For a 20 bit accumulator with a 24 MHz selected output frequency and a 19.68 MHz reference frequency, the correct value of X is, from Equation 6, 188744. For example, if the initial state of the accumulator, Y, is 0, then the subsequent states resulting from subsequent cycles of the selected output will be, using Equation 1, 188744, 377488, 566232, 754976 and 943720. On the next selected output cycle, the accumulator will overflow giving, from Equation 2, $11322464 - 2^{20} = 83888$ (decimal).

The four MSBs of these accumulator states form the numbers 0 for the initial state then, 2, 5, 8, 11, 14. After the overflow, the four MSBs form the number 1. This output sequence should in turn select OUT16, as the initial phase, then OUT14, OUT11, OUT8, OUT5, OUT2, and after the overflow, OUT15. These results are summarized in Table 1 below:

TABLE 1

| Previous Accumulator State ($Y_0$ in decimal) | Current Accumulator State ($Y_1$) in decimal) | 4 MSBs of Current Accumulator State ($Y_1$) in binary | 4 MSBs of Current Accumulator State ($Y_1$) in decimal | Phase Chosen |
|---|---|---|---|---|
| — | 0 | 0000 | 0 | OUT16 |
| 0 | 188744 | 0010 | 2 | OUT14 |
| 188744 | 377488 | 0101 | 5 | OUT11 |
| 377488 | 566232 | 1000 | 8 | OUT8 |
| 566232 | 754976 | 1011 | 11 | OUT5 |
| 754976 | 943720 | 1110 | 14 | OUT2 |
| 943720 | 83888 | 0001 | 1 | OUT15 |

Although the long term accuracy of the synthesizer is limited only by the accuracy of the reference and the number of bits in the accumulator, the synthesizer will have a periodic jitter whose amplitude will be at least one-half the time interval between phase signals. Increasing the number of phase signals will reduce this time interval. The error is slightly more than one-half the time interval between phases because the interval between phases will not be exactly the same once imperfections in the delay elements are taken into account. These delay elements form the multiphase reference for producing the different phase signals and can be a Johnson counter, frequency divider, or a ring oscillator.

It should be noted that the parameters of the embodiments described above can be extended. Specifically, the number of phase signals is not constrained to 16. If the number of phase signals to choose from can be extended to a number which is a higher power of 2 (i.e. 32, 64, etc.), then the accumulator need not be changed. It is apparent that the multiplexer would have to be capable of handling the number of phase signals available. Also, instead of only using the 4 MSBs of the selector output 80, more bits would have to be included in the select word.

However, while the above-contemplates using a number of phase signals which is an even power of 2, the design can be further extended to phase signals which are not an even power of 2. As an example, if the number of phase signals was 20, two possible routes can be taken to implement the invention. Specifically, the accumulator can be designed to overflow at a multiple of 20 where the multiple is a "round" binary number such as 2, 4, 8 etc. The 5 MSBs can then be used to select one of the 20 phase signals. The 5 MSBs could be constrained to be in the range from 0 to 19 by suitable logic gating.

Figure 5:
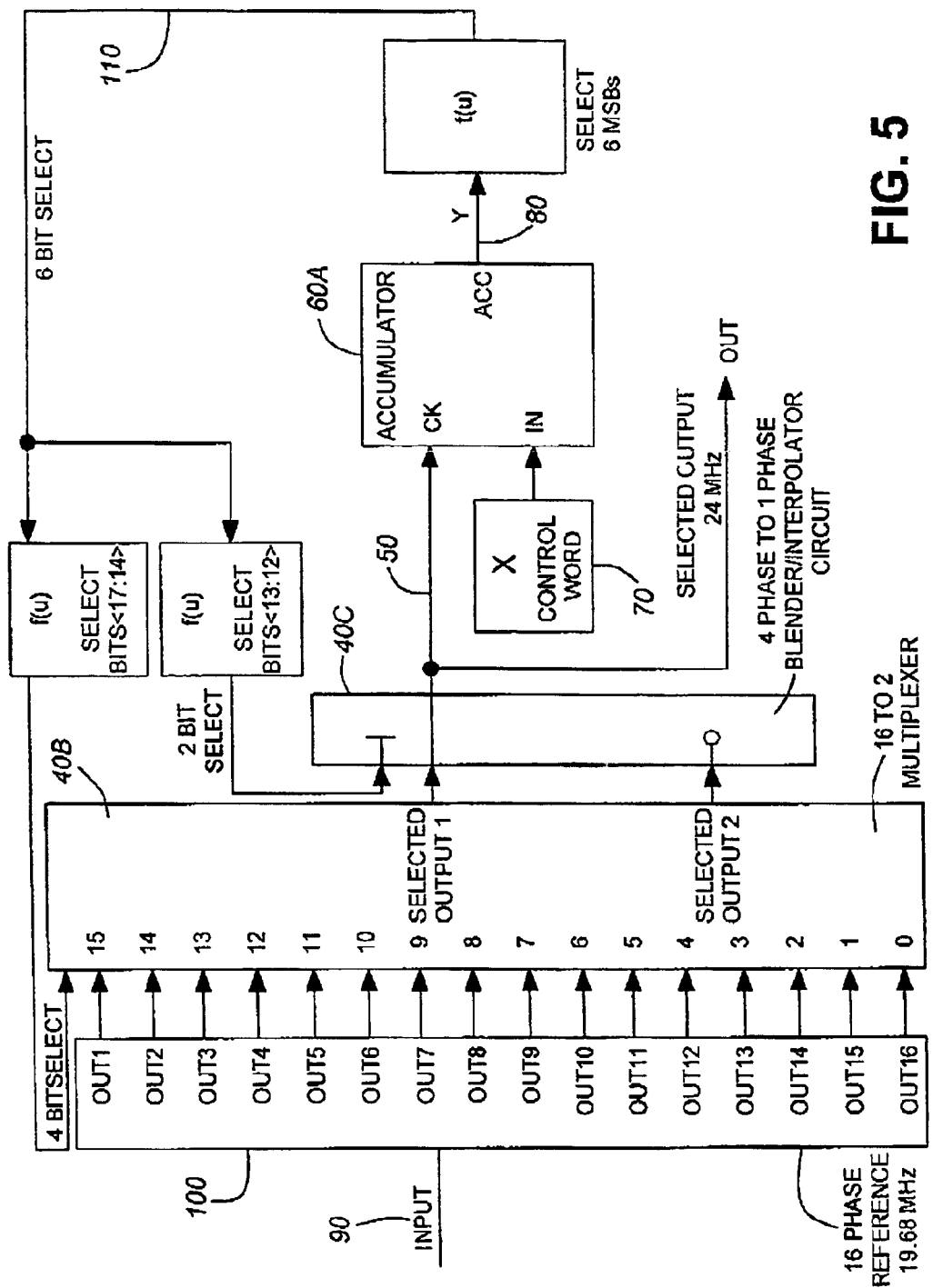
FIG. 5 is a block diagram of a second embodiment of the invention.

It should also be noted that the phase generator and the phase selector need not be completely separate. FIG. 5 illustrates an embodiment which uses 64 phase signals but does not require that all 64 phase signals be generated. The 64 phase signals are derived from only 16 phase signals.

In the embodiment of FIG. 5, the multiplexer comprises a 16×2 multiplexer 40B and a blender/interpolator circuit 40C. The 16×2 multiplexer 40B selects two of the 16 phase signals based on a portion of the select word 110. The blender/interpolator circuit 40C is a 4 phase to 1 phase. interpolator circuit which can generate specific delays, between its inputs. The phase generator 100 and the accumulator 60A remain the same as shown in FIGS. 2 and 3. However, instead of only using the 4 MSBs of the selector output 80 as the select word 110, 6 MSBs are used. The added 2 MSBs are used to control the blender/interpolator circuit 40C.

In FIG. 5, rather than selecting a single phase signal, two adjacent phase signals are selected by the four MSBs (bits 19 to 16) of the selector output 60A. These two selected phase signals are then blended or interpolated to produce a phase signal (the MUX output) with some fixed delay plus an additional variable delay that is a portion of the delay between the two selected phase signals. The variable delay is controlled by the two LSBs (bits 15 and 14) of the six. MSBs (bits 19 to 14) of the accumulator output 80.

It is important to have the control of the blending circuit 40B provide the same result as if the six bit select sort were directly controlling a 64 phase reference. To provide this result, with the four bit select word values of 0 to 15 (of bits 19–16) selecting phases OUT1 to OUT16 respectively, the 2 bit select word values of 0 to 3 (of bits 15–14) should respectively select increasing variable delays.

A person understanding the above-described invention may now conceive of alternative designs, using the principles described herein. All such designs which fall within the scope of the claims appended hereto are considered to be part of the present invention.

I claim:

1. A frequency synthesizer for producing an output signal based on an input signal and a predetermined control signal, the input signal having an input frequency, the output having an output frequency higher than the input frequency, the synthesizer comprising:
a multiphase reference generator having means for generating a plurality of phase signals from the input signal, each phase signal having a frequency substantially equal to the input frequency, and each phase signal being out of phase with the other phase signals by a multiple of a predetermined time interval;
a multiplexer having means for receiving the plurality of phase signals, and having means for selecting one of the plurality of phase signals as a multiplexer output signal; and
a phase selector had means for receiving the predetermined control signal and the multiplexer output signal, and having means for generating a phase selector output signal based on the control signal and the multiplexer output signal;
wherein the phase selector output signal is operatively coupled to the means for selecting one of the plurality of phase signals, and
the multiplexer output signal is the frequency synthesizer output signal.

2. The frequency synthesizer as in claim 1, further comprising a means for selecting a portion of the phase selector output signal operatively coupled to the means for selecting one of the plurality of phase signals of the multiplexer.

3. The frequency synthesizer as in claim 2, wherein the one of the plurality of phase signals is selected as the multiplexer output signal by the phase selector output signal on the occurrence of a rising edge of the multiplexer output.

4. The frequency synthesizer as in claim 2, wherein the one of the plurality of phase signals is selected as the multiplexer output signal by the phase selector output signal on the occurrence of a falling edge of the multiplexer output.

5. The frequency synthesizer as in claim 3 or 4, wherein each successive phase signal selected by the phase selector output signal leads a preceding phase signal by a multiple of the predetermined time interval.

6. The frequency synthesizer as in claim 2, wherein the phase generator is chosen from the group comprising: a ring oscillator, a Johnson counter circuit, and a delay locked loop circuit.

7. The frequency synthesizer as in claim 1, wherein the predetermined control signal is a predetermined binary word.

8. The frequency synthesizer as in claim 2, wherein the phase selector is a bar digital accumulator having a clock input, an accumulator input, and an accumulator output, wherein the predetermined control signal is operatively coupled to the accumulator input, wherein the multiplexer output signal is operatively coupled to the clock signal, and wherein the accumulator output is operatively coupled to the phase selector output signal.

9. The frequency synthesizer as in claim 3, wherein the binary digital accumulator adds the predetermined binary word to a binary stored value on each cycle of the multiplexer output signal, and wherein the binary stored value is the accumulator output.

10. The frequency synthesizer as in claim 9, wherein the phase selector output signal is transmitted to the means for selecting one of the plurality of phase signals as a select word.

11. A frequency synthesizer for producing an output signal from an input signal based on a predetermined control signal, the input signal having an input frequency, the output signal having an output frequency higher than the input frequency, the synthesizer comprising:
a multiphase reference generator having means for generating a plurality of phase signals from the input signal, each phase signal having a frequency substantially equal to the input frequency, and each phase signal being out of phase with the other phase signals by a multiple of a predetermined time interval;
a multiplexer having means for receiving the plurality of phase signals, having means for selecting at least two of the plurality of phase signals, and having means for blending/interpolating the at least two of the plurality of phase signals into a multiplexer output signal; and
a phase selector having means for receiving the predetermined control signal and the multiplexer output signal, and having means for generating a phase selector output signal based on the control signal and the multiplexer output signal;
wherein the phase selector output signal is operatively coupled to the means for selecting one of the plurality of phase signals, and
the frequency synthesizer output signal is the multiplexer output signal.

12. The frequency synthesizer as in claim 11, further comprising a means for selecting a portion of the at least two phase selector output signals operatively coupled to the means for selecting one of the plurality of phase signals of the multiplexer.

13. The frequent synthesizer as in claim 12, wherein each successive multiplexer output signal selected by the phase selector output signal leads a preceding multiplexer output signal by a multiple of the predetermined time interval.

14. The frequency synthesizer as in claim 13, wherein the phase generator is chosen from the group comprising: a ring oscillator, a Johnson counter circuit; and a delay locked loop circuit.

15. The frequency synthesizer as in claim 14, wherein the predetermined control signal is a predetermined binary word.

16. The frequency synthesizer as in claim 15, wherein the phase selector is a binary digital accumulator having a clock input, an accumulator input and an accumulator output, wherein the predetermined control signal is operatively coupled to the accumulator input, wherein the multiplexer output signal is operatively coupled to the clock signal, and wherein the accumulator output is operatively coupled to the phase selector output signal.

17. The frequency synthesizer as in claim 16, wherein the binary digital accumulator adds a predetermined binary control word to a binary stored value on each cycle of the multiplexer output signal, and wherein the binary stored value is the accumulator output.

18. The frequency synthesizer as in claim 17, wherein the phase selector output signal is transmitted to the means for selecting at least two of the plurality of phase signals as a select word.

19. The frequency synthesizer as in claim 18, wherein the at least two selected phase signals are selected based on a portion of a select word.

20. The frequency synthesizer as in claim 11, wherein the multiplexer output signal includes a variable delay determined by a delay between the selected phase signals and a first portion of the select word.

21. A frequency synthesizer comprising:

a phase generator having means for receiving an input signal having a reference frequency and means for generating a plurality of phase signals having a frequency substantially equal to the reference frequency, each phase signal being out of phase with the input signal by a multiple of a predetermined time interval;

a multiplexer having means for receiving the plurality of phase signals, and having means for selecting one of the plurality of phase signals as a multiplexer output signal;

a binary digital accumulator having a clock input, an accumulator input and an accumulator output, the multiplexer output signal being operatively coupled to the clock input; and a storage means for storing a predetermined control word, the storage means being operatively connected to accumulator input, wherein
the predetermined control word is added by the binary digit accumulator to a stored value on every cycle of the multiplexer output
the multiplexer output is selected by the selector output and is based on at least one of the plurality of phase signals and
each successive multiplexer output leads its predecessor by a multiple of the predetermined time interval.

22. A method of synthesizing an output signal from based on an input signal and a predetermined control signal, the input signal having an input frequency, the output signal having an output frequency higher than the input frequency, the method comprising the steps of:

(a) generating a plurality of phase signals from the input signal;

(b) selecting one of the plurality of phase signals as a selected phase signal;

(c) generating the output signal from the selected phase signal;

(d) adding the predetermined control word to a stored value to generate a select signal based on the selected phase signal;

(e) selecting one of the plurality of phase signals as the selected phase signal based on at least a portion of the select signal;

(f) repeating steps (c) to (e) for every cycle of the output signal.

23. The method as claimed in claim 22, wherein each successive output signal leads its predecessor by a multiple of the predetermined time interval.

24. The method as in claim 23 wherein step (b) includes selecting at least two phase signals from the plurality of phase signals based on at least a portion of the select word, and wherein step (c) includes blending the at least two selected phase signals to generate the output signal.

* * * * *